United States Patent [19]

Kinzer

[11] Patent Number: 4,888,504

[45] Date of Patent: Dec. 19, 1989

[54] BIDIRECTIONAL MOSFET SWITCHING CIRCUIT WITH SINGLE GATE BIAS

[75] Inventor: Daniel M. Kinzer, El Segundo, Calif.

[73] Assignee: International Rectifier Corporation, El Segundo, Calif.

[21] Appl. No.: 255,111

[22] Filed: Oct. 7, 1988

[51] Int. Cl.[4] .................. H03K 17/60; H03K 17/687; H03K 19/094; H03K 3/01

[52] U.S. Cl. ..................... 307/570; 307/571; 307/585; 307/451; 307/270; 357/23.4; 357/46

[58] Field of Search .............. 307/570, 571, 574, 585, 307/583, 576, 579, 451, 270, 311; 357/23.4, 46

[56] References Cited

U.S. PATENT DOCUMENTS

| | | | |
|---|---|---|---|
| 4,540,893 | 9/1985 | Bloomer | 307/571 |
| 4,647,794 | 3/1987 | Guajardo | 307/570 |
| 4,649,302 | 3/1987 | Damiano et al. | 307/571 |
| 4,721,986 | 1/1988 | Kinzer | 357/23.4 |
| 4,777,387 | 10/1988 | Collins | 307/571 |

FOREIGN PATENT DOCUMENTS 2590749  5/1987  France .................. 307/571

OTHER PUBLICATIONS

International Recitier Hexfet Databook, published by International Rectifier (the present Assignee) (3rd Ed.) pp. A-65 to A-76.

Primary Examiner—Stanley D. Miller
Assistant Examiner—Trong Quang Phan
Attorney, Agent, or Firm—Ostrolenk, Faber, Gerb & Soffen

[57] ABSTRACT

A bidirectional MOSFET switching circuit employs a pair of common-drain-connected power MOSFETs whose sources are connected to respective nodes for serial connection to a supply-and-load circuit. A gate control circuit provides gate bias for both power MOSFETs from a single gate bias provided between first and second nodes. The gate control circuit includes a pair of common-source-connected control MOSFETs with their sources connected to the first node; with their drains respectively connected to the respective gates of the power MOSFETs; and with their gates connected in common to the second node and to the common-connected drains of the power MOSFETs. The gate bias is preferably provided by a photovoltaic initiator circuit which can be integrated into a monolithic IC along with the power MOSFETs and control circuit.

12 Claims, 2 Drawing Sheets

BIDIRECTIONAL MOSFET SWITCHING CIRCUIT WITH SINGLE GATE BIAS

BACKGROUND AND SUMMARY OF THE INVENTION

The present invention relates to a bidirectional MOSFET switching circuit operating with a single gate bias, and more particularly to such a circuit including a pair of common-drain-connected power MOSFETs of the source-to-base-shorted type.

Bidirectional switching capability has been conventionally provided in circuits employing a pair of power MOSFETs with their sources connected in common and with their drains respectively connected to a pair of nodes for serial connection to a supply-and-load circuit. One such circuit is disclosed in U.S. Pat. No. 4,721,986, which is by the present inventor and assigned to the present assignee. Since the gate-to-source voltage of a power MOSFET typically determines its conduction state, the use of common-source-connected MOSFETs conveniently permits a single gate bias to simultaneously turn on both MOSFETs due to the common source connection.

It would, however, be desirable to provide a bidirectional MOSFET switching circuit employing a pair of common-drain-connected power MOSFETs, since common-drain-connected MOSFETs allow more efficient vertical current conduction in a monolithic IC using available technology. It would further be desirable to provide such a switching circuit with a single gate bias voltage for turning on both power MOSFETs despite the lack of a common source connection for providing common gate-to-source biasing.

The foregoing problem is overcome in one form of the invention which, as briefly stated, includes the combination of (i) a bidirectional switching circuit including a pair of common-drain-connected power MOSFETs having their sources respectively connected to a pair of nodes for serial connection to a load-and-supply circuit and (ii) a gate control circuit for providing gate bias for both power MOSFETs from a single gate bias voltage respectively provided between first and second nodes. The power MOSFETs are of the source-to-base-shorted type so that each contains an inherent P-N diode. The gate control circuit, in preferred form, comprises a pair of common-source-connected gate control MOSFETs with their sources commonly connected to the first node; with their drains respectively connected to the respective gates of the pair of power MOSFETs; and with their gates connected in common to the second node and to the common-connected drains of the power MOSFETs.

In operation of the invention, the inherent P-N diode of the second-to-turn-on power MOSFET approriately biases the source of such second-to-turn-on transistor to induce such transistor to turn on.

Other objects and features of the present invention will become apparent from the following description of the preferred embodiments of the invention considered in conjunction with the accompanying drawings.

DETAILED DESCRIPTION OF THE PREFERRED EMBODIMENTS

Figure 1:
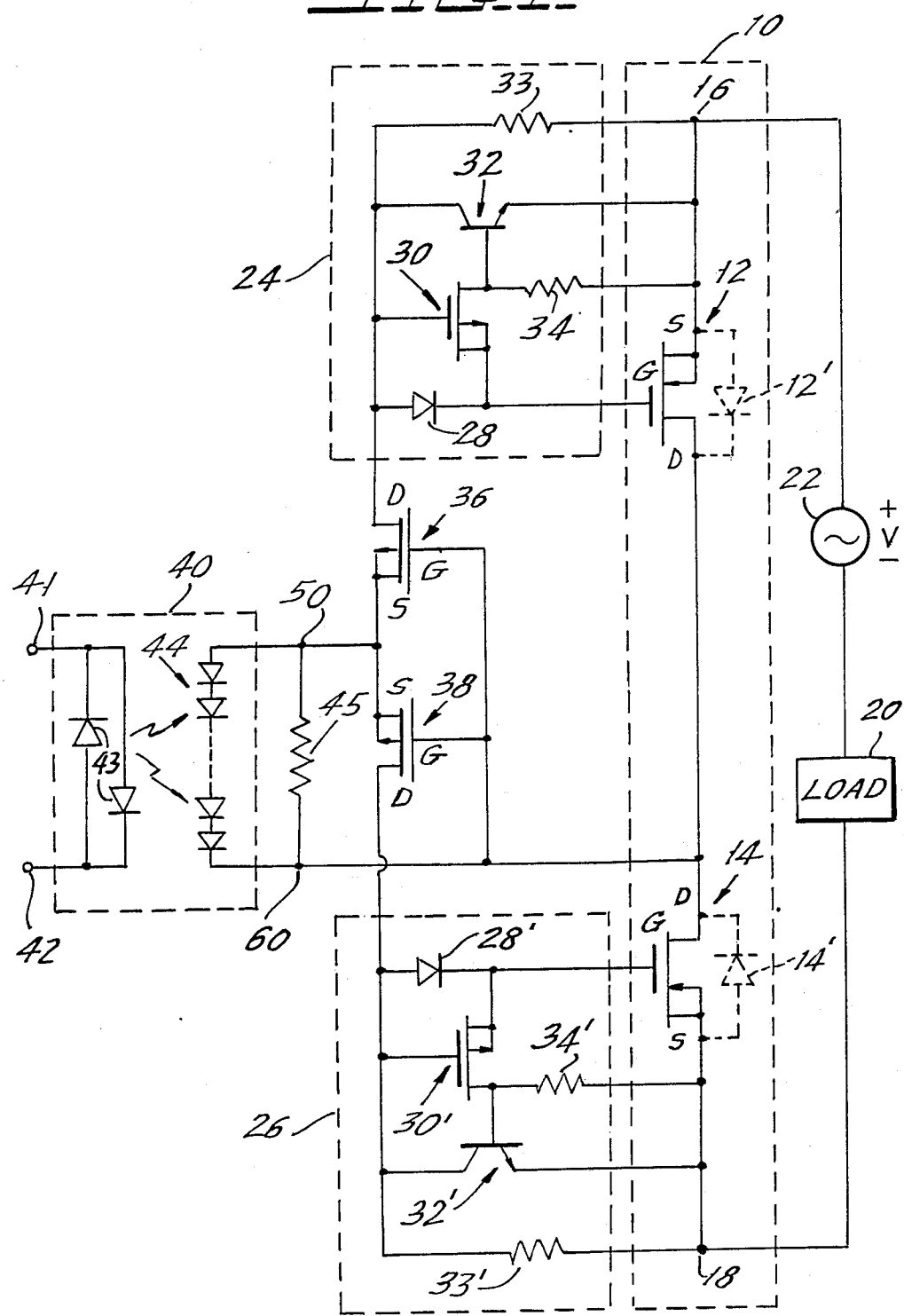
FIG. 1 is a schematic diagram of a bidirectional MOSFET switching circuit with a single gate bias in accordance with the present invention.

In the drawing figures, like reference numerals refer to like parts unless otherwise noted.

FIG. 1 shows a schematic circuit diagram of a bidirectional switching circuit with a single gate bias in accordance with the invention. The inventive circuit comprises a pair 10 of common-drain-connected power MOSFETs 12 and 14. The source electrodes S of MOSFETs 12 and 14 are respectively connected to nodes 16 and 18 for serial connection to a load-and-supply circuit comprising a load 20 and a power supply 22 for the load. Power supply 22 preferably provides current that is bidirectional (e g., a-c), although the common-drain-connected power MOSFETs 12 and 14 can accommodate d-c current as well.

Figure 2:
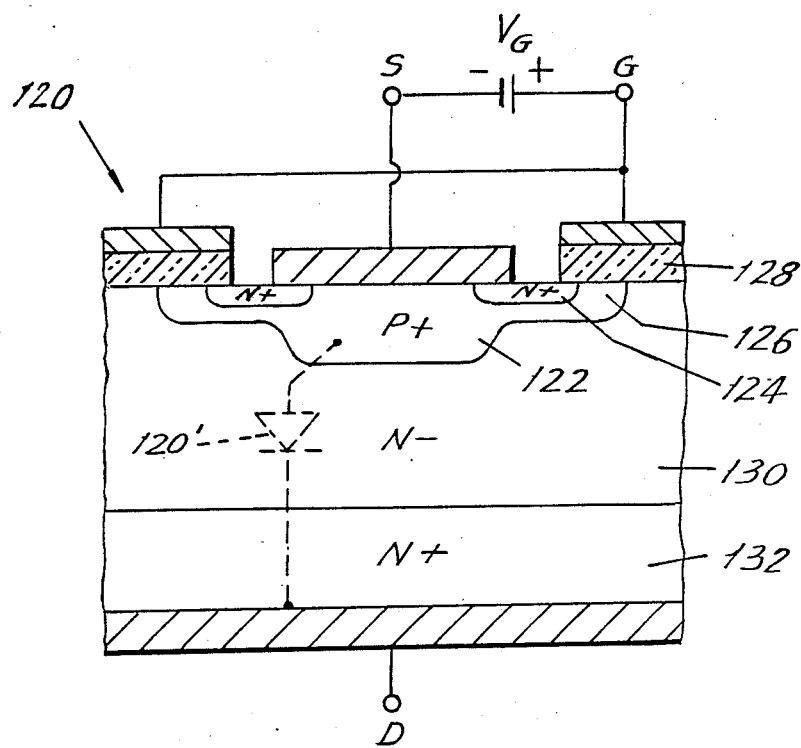
FIG. 2 is a simplified cross-section of one cell of a multicellular power MOSFET which is suitable for use in the circuit of FIG. 1 and which shows an inherent P-N diode associated with a source-to-base-shorted feature of the illustrated MOSFET.

Power MOSFETs 12 and 14 are structured to include respective, inherent P-N diodes 12' and 14', shown in dashed lines The inclusion of an inherent P-N diode in MOSFETs 12 and 14 can be better appreciated from considering FIG. 2, which is a simplified cross-section of one cell of a multicellular MOSFET 120. MOSFETs 12 and 14 can be implemented with the structure of MOSFET 120.

MOSFET 120 of FIG. 2 includes a P-conductivity type channel-containing region 122 in which N-conductivity type source region 124 is disposed to define a surface channel 126 beneath a gate G spaced by a dielectric layer 128 from channel 126. P channel-containing region 122 is more succinctly referred to herein as a "base" region in accordance with convention in the art. (The term "base" is used since such region 122 serves as the base of a parasitic NPN bipolar transistor comprising N region 126, P region 122 and N regions 130 and 132.)

The source electrode S of MOSFET 120 adjoins not only the source region 124, but also the base region base 122. MOSFET 120 is thus of the source-to-base-shorted type. With the source electrode S of MOSFET 120 connected to P base region 122, an inherent P-N diode 120' (shown in dashed lines) between source region S and drain region D is formed by P base region 122 and N-conductivity type drain regions 130 and 132.

The illustrative cell of MOSFET 120 shown in FIG. 2 is also useful for describing the process of applying a gate bias to MOSFET 120 to cause it to turn on. Thus, a gate bias voltage $V_G$ is applied between gate and source terminals G and S, respectively, of MOSFET 120. The gate terminal G is biased with a positive potential with respect to the source terminal S. The gate bias voltage $V_G$ is selected to result in an inversion layer, conductive to electrons, appearing in surface channel region 126 This completes a current path from the source electrode S to the drain electrode D via the inversion channel in region 126, source region 124 and drain regions 130 and 132.

It is helpful to note that the gate G of device 120 is biased with respect to source S rather than to drain D. This is partly a result of the source-to-base-shorted feature of MOSFET 120, which references the surface channel region 126 with respect to the source electrode S since both are shorted together.

Associated with common-drain-connected MOSFETs 10 in FIG. 1 are fast turn-off circuits 24 and 26. Fast turn-off circuit 24 includes a P-N diode 28 for rectifying current to the gate G of MOSFET 12 and a PMOS transistor 30 which is biased on when diode 28 becomes reverse biased. PMOS transistor 30 cooperates with NPN bipolar transistor 32 to rapidly remove charge from gate G of MOSFET 12 upon cessation of gate drive through diode 28 to the gate of MOSFET 12. Resistor 33 is used to initiate the turn-off action and to keep the MOSFET gate-to-source voltage low during the off state. Resistor 34 provides a current path from PMOS transistor 30 to node 16. Further details of fast turn-off circuit 24 are described in U.S. Pat. No. 4,721,986, which is by the present inventor, assigned to the present assignee and incorporated herein by reference. Turn-off circuit 26 corresponds to turn-off circuit 24.

Of relevance to an aspect of the present invention in the turn-off circuits 24 and 26 are the current paths through P-N diodes 28 and 28', which provide gate bias to the associated gates of MOSFETs 12 and 14. The diodes 28 and 28' cooperate with their respective fast turn-off circuits 24 and 26, and could be omitted if the turn-off circuits 24 and 26 were omitted.

Common-source-connected PMOS transistors 36 and 38 are used to translate the single gate bias from a supply 40 into appropriate biases for the gates of output MOSFETs 12 and 14 The drain D of transistor 36 is connected to the anode of P-N diode 28, and the drain D of transistor 38 is likewise connected to the anode of diode 28'. The commonly-connected sources of transistors 36 and 38 are connected to positive terminal 50 of supply 40, and the gates of such transistors are commonly connected to the negative terminal 60 of supply 40 and to the commonly-connected drains of output MOSFETs 12 and 14.

The single gate bias supply 40 is illustratively shown as a photovoltaic initiator (PVI) circuit, which provides optical isolation between an input signal between nodes 41 and 42 and output MOSFETs 12 and 14. LEDs 43 are connected for one of them to turn on with either polarity voltage between nodes 41 and 42 and to illuminate a stack of photovoltaic diodes 44 When exposed to illumination, photovoltaic diodes 44 provide a gate bias voltage between output nodes 50 and 60. A very high impedance resistor 45 of typically 5 megohms in value is connected between nodes 50 and 60. Photovoltaic diodes 44 may advantageously be integrated in a monolithic IC together with MOSFETs 12 and 14 and their associated turn-off circuits 24 and 26. Further details of PVI circuit 40 are provided in copending application Ser. No. 573,305, filed on Jan. 23, 1984, which is by the present inventor, assigned to the present assignee and incorporated herein by reference.

The procedure for biasing output MOSFETs 12 and 14 from single gate bias supply 40 is now described. With the PVI 40 off, the PMOS devices 36 and 38 are likewise off. Now assuming that the load voltage supply 22 is at positive 50 volts and node 18 at ground potential, the inherent diode 12' is biased on while the inherent diode 14' is biased off. With diode 12' on, the common drains of transistors 12 and 14 are at about 49 volts, since the voltage drop across forward-biased P-N diode 12' is almost 1 volt. Node 50 of PVI 40 at this time is also at about 49 volts.

When PVI 40 turns on, it provides a voltage at node 50 of about 54 volts, or about 5 volts higher than that on node 60. Concurrently, PMOS devices 36 and 38 are biased on.

With PMOS transistor 38 on, the approximately 54 volts appearing on node 50 and dropped by about 1 volt across now forward-biased P-N diode 28' provides about 53 volts on the gate of MOSFET 14. Since the source of MOSFET 14 is at ground potential, MOSFET 14 is gated into conduction. When MOSFET 14 turns on, its drain D and hence node 60 of PVI 40 is pulled to ground potential. Meanwhile, the source S of upper MOSFET 12 is pulled downwardly to about 1 volt since the inherent P-N diode 12' is still forward-biased. The 5 volts appearing at node 50 of the PVI 40 is now applied to the gate of upper MOSFET 12 via P-N diode 28. The resulting gate-to-source biasing potential of MOSFET 12 is somewhat greater than 3 volts, and is sufficient to turn the upper MOSFET 12 on.

The top and bottom halves of the circuit of FIG. 1 are symmetrical to each other; therefore, if the load voltage V is at negative 50 volts, for example, the MOSFETs 12 and 14 will turn on in reverse sequence from that just described.

In accordance with the foregoing description, it will be apparent that the forward-biased condition of the inherent P-N diode of the second-to-turn-on MOSFET 12 or 14 biases the source of such second-to-turn-on transistor so that the voltage on its gate will cause such second transistor to turn on.

The foregoing describes a bidirectional MOSFET switching circuit with a single gate bias. The switching circuit includes a pair of common-drain-connected power MOSFETs having their sources respectively connected to a pair of nodes for serial connection to a load-and-supply circuit. Such power MOSFETs are of the source-to-base shorted type. An associated gate control circuit beneficially comprises a photovoltaic initiator circuit including photovoltaic diodes which can be readily integrated into a monolithic IC along with the MOSFET switching circuit.

Although the present invention has been described in connection with a plurality of preferred embodiments thereof, many other variations and modifications will now become apparent to those skilled in the art. It is preferred, therefore, that the present invention be limited not by the specific disclosure herein, but only by the appended claims.

What is claimed is:

1. In combination with a bidirectional switching circuit including a pair of common-drain-connected power MOSFETs having their sources respectively connected to a pair of nodes for serial connection to a load-and-supply circuit and being of the source-to-base-shorted type, a gate control circuit for providing gate bias for both power MOSFETs from a single gate bias voltage respectively provided between first and second nodes, the gate control circuit comprising a pair of common-source-connected gate control MOSFETs with their sources connected to the first node; with their drains respectively connected to the respective gates of the pair of power MOSFETs; and with their gates connected in common to the second node and to the common-connected drains of the power MOSFETs.

2. The invention of claim 1, wherein an inherent P-N diode in a second-to-turn-on one of the power MOSFETs serves to bias the source of the second-to-turn-on power MOSFET to a level permitting turn-on of such second power MOSFET.

3. The invention of claim 1, wherein the power MOSFETs comprise NMOS devices.

4. The invention of claim 3, wherein the control MOSFETs comprise PMOS devices.

5. The invention of claim 1, further comprising in association with each power MOSFET a respective P-N diode in serial circuit between the drain of an associated control MOSFET and the gate of such power MOSFET.

6. The invention of claim 1, further comprising respective circuits associated with the respective gates of the power MOSFETs to enhance the turn-off speed of such MOSFETs.

7. In combination with a bidirectional switching circuit including a pair of common-drain-connected power MOSFETs having their sources respectively connected to a pair of nodes for serial connection to a load-and-supply circuit and being of the source-to-base-shorted type, a gate control circuit for providing gate bias for both power MOSFETs from a single photovoltaic initiator circuit providing a gate bias voltage between first and second nodes, the control circuit comprising a pair of common-source-connected gate control MOSFETs with their sources connected to the first node; with their drains respectively connected to the respective gates of the pair of power MOSFETs; and with their gates connected in common to the second node and to the common-connected drains of the power MOSFETs.

8. The invention of claim 7, wherein an inherent P-N diode in a second-to-turn-on one of the power MOSFETs serves to bias the source of the second-to-turn-on power MOSFET to a level permitting turn-on of such second power MOSFET.

9. The invention of claim 7, wherein the power MOSFETs comprise NMOS devices.

10. The invention of claim 9, wherein the control MOSFETs comprise PMOS devices.

11. The invention of claim 7, further comprising in association with each power MOSFET a respective P-N diode in serial circuit between the drain of an associated control MOSFET and the gate of such power MOSFET.

12. The invention of claim 7, further comprising respective circuits associated with the respective gates of the power MOSFETs to enhance the turn-off speed of such MOSFETs.

* * * * *